United States Patent [19]

Izumi et al.

[11] Patent Number: 5,018,936

[45] Date of Patent: May 28, 1991

[54] ELECTRONIC PARTS ENGAGING APPARATUS

[75] Inventors: Yasuo Izumi, Ikoma; Kazumi Ishimoto, Katano; Yutaka Makino, Kobe, all of Japan

[73] Assignee: Matsushita Electric Industrial Co., Ltd., Osaka, Japan

[21] Appl. No.: 371,973

[22] Filed: Jun. 27, 1989

[30] Foreign Application Priority Data

Jun. 29, 1988 [JP] Japan .............................. 63-161605
Jul. 25, 1988 [JP] Japan .............................. 63-184963
Jul. 25, 1988 [JP] Japan .............................. 63-184966

[51] Int. Cl.$^5$ ............................................. B25J 15/06
[52] U.S. Cl. ..................................... 414/752; 29/721; 29/740; 29/743; 219/121.65; 219/121.83; 901/40; 901/41; 901/44; 901/47; 414/225
[58] Field of Search ............... 414/225, 737, 752; 29/740, 743, 720, 721; 219/121.63, 121.64, 121.83, 121.84; 901/40, 41, 44, 47

[56] References Cited

U.S. PATENT DOCUMENTS 4,345,371  8/1982  Ohsawa et al. .................. 29/740 X
4,668,088  5/1987  Quinque et al. ........... 219/121.83 X
4,696,101  9/1987  Vanzetti et al. ..................... 29/740

Primary Examiner—F. J. Bartuska
Assistant Examiner—Donald W. Underwood
Attorney, Agent, or Firm—Wenderoth, Lind & Ponack

[57] ABSTRACT

An electronic parts engaging apparatus is equipped with a parts feed portion having a plurality of parts feed devices disposed to feed, for each type of part, parts having marks indicating their separate type. A suction nozzle is composed of a light transmitting material. A recognition device recognizes the parts through the suction nozzle. A memory stores the types of the parts of the respective parts feed devices in the parts feed portion. A control stores in the memory the types of the parts found through the recognition of the marks of the parts of the respective parts feed devices with the recognition device. A periodical washing operation has an effect in that the control operation is simplified.

8 Claims, 11 Drawing Sheets

5,018,936

ELECTRONIC PARTS ENGAGING APPARATUS

BACKGROUND OF THE INVENTION

The present invention generally relates to an electronic parts engaging apparatus to be used in cases where the electronic parts are suctioned up for engagement with a circuit basic plate, and more particularly, to an electronic parts engaging apparatus which is equipped with a suction nozzle made of a transparent material.

Conventionally, in order to engage the electronic parts with the circuit basic plate, a bonding agent is applied on the electronic parts engaging position of the circuit basic plate and also, solder for reflowing use is applied on the electrode. The electronic parts to be engaged with in a parts feeding portion are suctioned by a suction nozzle. The suctioned electronic parts are carried to the electronic parts engaging position of the circuit basic plate for the engaging operation thereof and are temporarily fixed with the bonding agent. After the engagement of all the electronic parts with respect to the circuit basic plate is completed, the circuit basic plate is inserted into the reflowing furnace to reflow the solder. The electronic parts are secured with the solder and an electronic connection is effected. When solder for reflowing use is not used, the circuit basic plate, with the electronic parts being temporarily secured thereto with the bonding agent, is dipped in a solder so as to solder-connect the electronic parts with the electrodes of the circuit basic plate.

It is to be noted that methods of temporarily securing the electronic parts are largely as follows.

(1) After the coating of the bonding agent on the basic plate, ultraviolet rays or the like are applied to improve the adherence of the bonding agent. Then, the parts are engaged to effect a temporary fixing operation.

(2) After the coating of the bonding agent on the basic plate, the electronic parts are engaged. The ultraviolet rays or the like are applied on the bonding agent so as to effect a temporary fixing operation.

Generally, the latter operation is superior in the binding force of the parts. But in the case of the former, the electronic parts do not move, and there is a problem that the parts move in the case of the latter.

Namely, there is a problem that the parts move before the application of the ultraviolet rays during a carrying operation of the basic plate, because the apparatus for applying ultraviolet rays is provided separately from the parts engaging apparatus.

As a result, the handling operation, such as the carrying operation of the basic plate, is difficult to effect, thus resulting in an inferior operation.

Furthermore, a step of engaging the electronic parts with the circuit basic plate to temporarily secure them with the bonding agent and a step of inserting the circuit basic plate into a reflowing furnace so as to actually secure the electronic parts onto the circuit basic plate are required, with a problem that the productivity is lowered.

SUMMARY OF THE INVENTION

Accordingly, an essential object of the present invention is to provide an electronic parts engaging apparatus which is capable of temporarily securing electronic parts without moving them so as to improve the operation of the actual fixing operation.

Another object of the present invention is an electronic parts engaging apparatus which is capable of effecting the engagement of the electronic parts and the actual fixing operation thereof in one step.

Still another object of the present invention is to provide a parts engaging apparatus which is capable of automating the input of parts data of a parts feed portion, and effectively using the parts without disusing any parts, even when the wrong types of parts are fed.

A further object of the present invention is to provide a parts engaging apparatus which is capable of removing the dirt of a suction nozzle made of a light transmitting material, so as to prevent recognition errors.

The parts engaging apparatus of the present invention is provided with a suction nozzle made of a light transmitting material and a light-ray application means for applying the light rays through the suction nozzle.

It is to be noted that a first object may be achieved by the use of an ultraviolet-ray application means as the light-ray application means.

Also, a second object may be achieved by the use of a laser light.

Also, the parts engaging apparatus of the present invention comprises a parts feed portion, where a plurality of parts feed means for feeding parts marked in accordance with each type of part are disposed, a suction nozzle made of a light transmitting material, a recognition means for recognizing the parts through the suction nozzle, a memory means for storing the types of parts for the respective parts feeding means in the parts feed portion, a controlling means for storing in the memory means the types of parts found through the recognition of the marks of the parts of the respective parts feeding means with the recognition means.

Furthermore, the parts engaging apparatus of the present invention comprises a suction nozzle made of a light transmitting material, a recognition means for recognizing through the suction nozzle the parts to be suctioned by the suction nozzle, and a cleaning means for the absorption nozzle.

BRIEF DESCRIPTION OF THE DRAWINGS

The above and other objects and features of the present invention will become apparent from the following description taken in conjunction with the preferred embodiment thereof with reference to the accompanying drawings, in which:

FIG. 15 (b) is a sectional view thereof.

DESCRIPTION OF THE INVENTION

Figure 1:
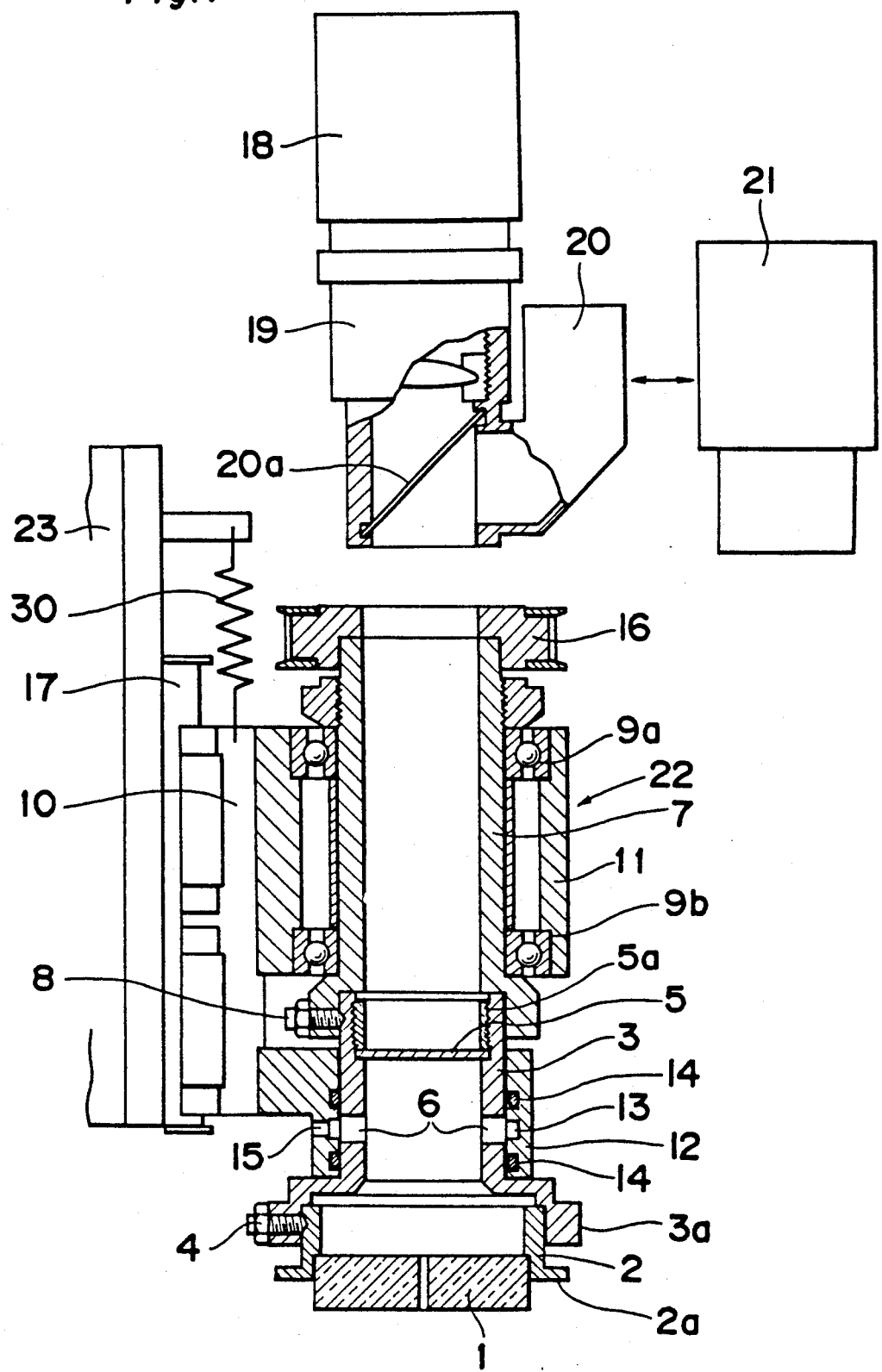
FIG. 1 is a sectional view of an electronic parts engaging apparatus according to a first embodiment of the present invention.

Before the description of the present invention proceeds, it is to be noted that like parts are designated by like reference numerals throughout the accompanying drawings.

Referring now to the drawings, there is retained in FIG. 1 a suction nozzle 1 made of a light transmitting material by a nozzle holder 2, which is engaged with the lower end portion of a suction drum 3 and also is engaged by an engagement fixture 4 so that the exchange may be effected with one touch in accordance with the size of the electronic parts to be suctioned. The top end portion of the suction drum 3 is screened by a light transmitting plate 5, with suction openings being formed on the peripheral side wall. Stationary nuts 5a are used for the light transmitting plate 5. The top end portion of the suction drum 3 is engaged with the lower end portion of a rotary drum 7 and is also engaged by an engagement fixture 8 so that it may be easily replaced when the interior of the suction drum 3 has been fouled.

The rotary drum 7 is rotatably supported by a support drum portion 11 disposed on an elevating member 10 through bearings 9a and 9b provided on the outer periphery of the upper portion and the lower portion thereof. Also, a suction outer drum 12 provided on the elevating member 10 is engaged with the outer periphery of the suction drum 3. A ring-shaped groove 13 is formed opposite to suction openings 6 on the periphery of the suction drum 3, with 0 rings 14 for sealing being disposed on both sides thereof. Also, a suction opening 14, to be connected to a suction source (not shown), is open to the ring-shaped groove 13.

A pulley 16 is secured to the upper end portion of the rotary drum 7 and is rotatably driven by a drive source (not shown). Also, the elevating member 10 may rise and fall along a guide 17 and is elastically supported by a moving table 23 through a spring 30.

A recognition camera 18 is disposed for movement between an axial center position above the rotary drum 7 and a waiting position sideways thereof. A half mirror 20a is disposed in the lower portion of the optical mirror drum 19 so that illumination light from illumination equipment 20, disposed on the side portion, is adapted to be applied towards the suction nozzle 1.

An ultraviolet light applying apparatus 2!, with the recognition camera 18, is selectively movable between the same axial center position above the rotary drum 7 and the waiting position sideways thereof.

Figure 2:
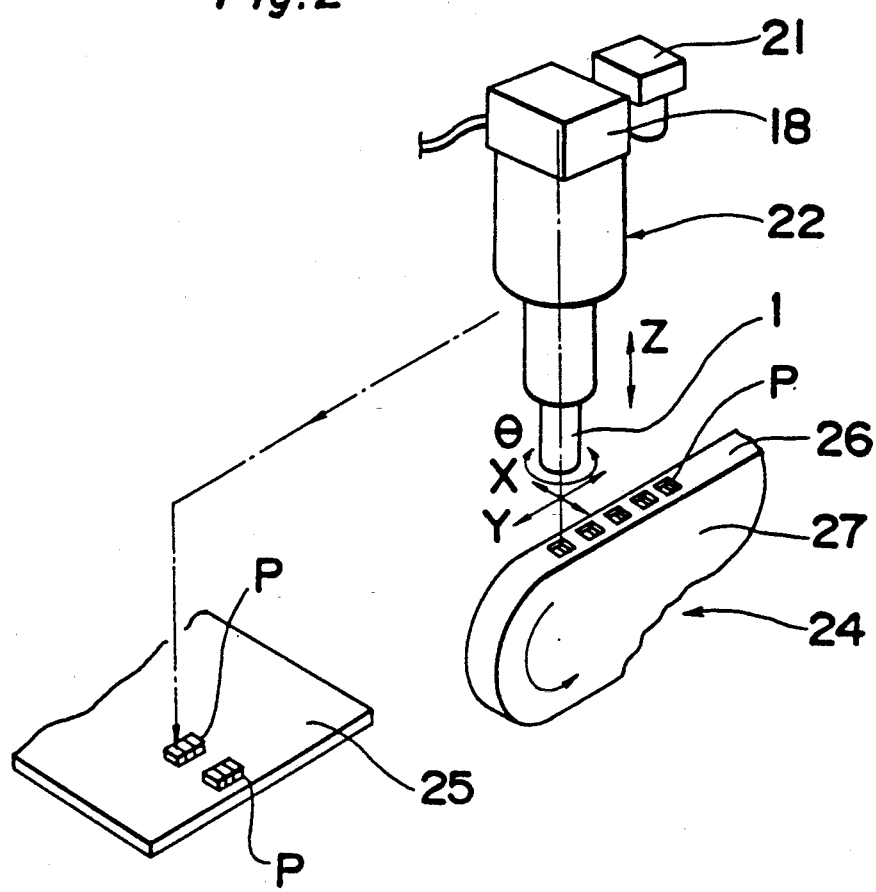
FIG. 2 is a view showing an engaging operation.

An engaging head 22 of the above-described construction is engaged with the moving table 23 and is constructed to move between a suction position of a parts feed portion 24 and an optional position whereat the electronic parts on a circuit basic plate 24 are to be engaged, as shown in FIG. 2. A parts cassette 27 with an electronic parts collection 26 being set thereinto is disposed in the parts feed portion 24. The electronic parts collection is composed of a plurality of electronic parts p retained in a tape-shaped member. The electronic parts p are adapted to be sequentially fed into the suction position.

The operation will be described hereinafter. At first, the engagement head 22 is oppositely positioned above the suction position of the parts feed portion 24 so as to recognize the shape of the electronic parts p of the suction position by the recognition camera 18 through the suction nozzle 1 and the light transmitting plate 5 made of a light transmitting material. When the electronic parts p are improper in shape, the operation does not go into a suction action. The parts cassette 27 is actuated so as to feed the next electronic part p into the suction position and to recognize the shape thereof again with the recognition camera 18.

When the shape of the electronic part p is proper, the moving table 23 lowers to suction the electronic part p by the suction nozzle 1 and rises again. Thereafter, the moving table 23 moves to a position above a given apparatus position of the circuit basic plate 25. At this time, the recognition camera 18 correctly recognizes the position of the suctioned electronic part p so as to detect the eccentric amount in the X-Y direction and the inclination angle $\theta$ with respect to the engagement posture of the electronic part p. The correction thereof is effected by correction of the movement amount of the moving table 23 and the rotation of the pulley 16. Thereafter, the moving table 23 is lowered to correctly engage the electronic part p with the given position of the circuit basic plate 25.

Figure 3:
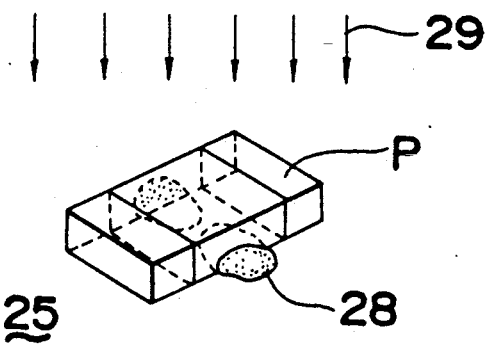
FIG. 3 is a perspective view showing the application condition of ultraviolet rays.

Continuously, the ultraviolet ray applying apparatus 21 is positioned on the same axial center as the suction nozzle 1. As shown in FIG. 3, ultraviolet rays 29 are applied upon a bonding agent 28 of an ultraviolet ray hardening type, partially leaked onto a side portion by the engagement of the electronic part p so as to temporarily secure the electronic part p.

By the repetition of the above-described operation, the proper electronic parts p are efficiently engaged sequentially with the electronic parts engaging positions on the circuit basic plate 25 so as to complete the engagement of all the electronic parts p. The circuit basic plate 25 is inserted into the reflowing furnace for the actual fixing operation with solder.

As described hereinabove, according to the present embodiment, the temporary fixing operation may be effected without the movement of the electronic parts.

A second embodiment of the present invention will be described hereinafter.

In the present embodiment, a laser ray applying apparatus instead of the ultraviolet ray applying apparatus 21 will be used.

Figure 4:
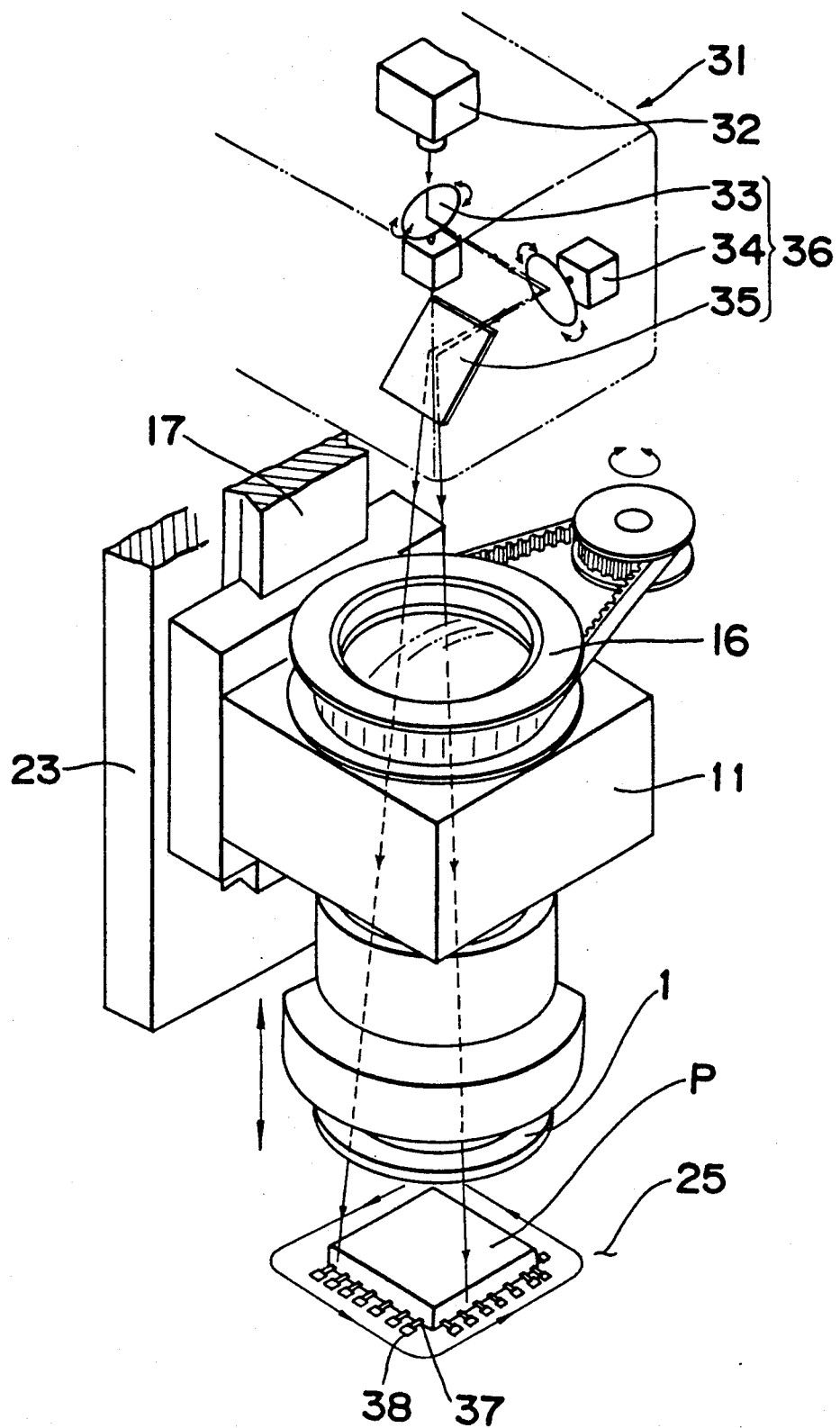
FIG. 4 is a sectional view of an electronic parts engaging apparatus according to a second embodiment of the present invention.

Referring to FIG. 4, a laser ray applying apparatus 31 comprises a laser generator 32, a scanning apparatus 36 composed of an X-galvanometer 33, a Y-galvanometer 34 and a mirror 35 so that the laser rays may be applied along an optional track.

The operation in the embodiment is similar to the first embodiment before the electronic parts p are engaged with the circuit basic plate 25. After the electronic parts p have been positioned and engaged, the laser rays applying apparatus 31 is positioned on the axial center of the suction nozzle 1, the laser generator 32 is operated and also, the scanning apparatus 36 is operated.

The laser rays are sequentially applied onto respective leads 37 of the electronic part p connected onto electrodes 38 of the circuit basic plate 25 to heat with the laser rays the solder for reflowing use coated on the electrode 38 for effecting the reflowing operation so as to connect the electrode 38 with the lead 37 through solder. After the connection of the lead 37 on the full periphery of the electronic parts p has been completed, the operation moves into the engagement action of the next electronic part p to repeat the above-described operations.

In this manner, the engagement with the circuit basic plate 25 of the electrode parts p and simultaneously the connection thereof may be effected in this manner.

Although in the embodiment, the bonding agent for temporarily securing the electronic parts p is not required to be applied upon the circuit basic plate 25, the bonding agent may be kept on it. Also, although the suction nozzle 1 may be separated from the electronic parts p after the engagement of the electronic parts p, the laser rays may be also applied with the electronic parts p being secured by pushing the nozzle 1 thereagainst.

As described hereinabove, according to the present embodiment, the solder for the reflowing use is applied upon the electrode through the sequential application of the laser rays on respective leads, with the lead of the electrode part being in contact with the electrode of the circuit basic plate during the engagement of the electronic parts, so that the reflowing step at the reflowing furnace may be removed through the connection between the electrode and the lead.

Furthermore, the ray applying means and the recognizing means are jointly disposed to be selectively positioned on the axial center of the suction nozzle to detect with the recognition means the position of the electronic parts suctioned at the parts feed position. After the correct engagement in the given position of the circuit basic plate through the correction of the positional slip, the recognition means is switched to the ray applying means so that the above-described operation may be effected immediately with respect to the engaged electrode parts.

A third embodiment of the present invention will be described hereinafter. The present embodiment is characterized in that the inputting operation of the parts data in the parts feed portion may be effected automatically, and the wrong types of parts if fed may be effectively used without being disused.

Figure 5:
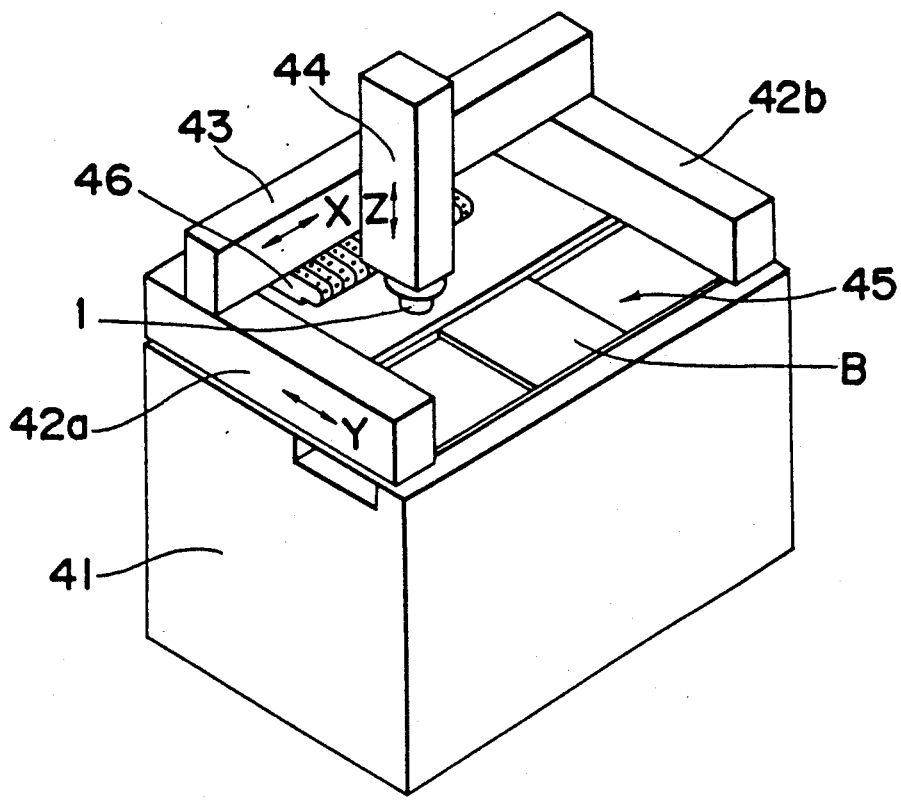
FIG. 5 is a perspective view of an electronic parts engaging apparatus according to a third embodiment of the present invention.

Referring to FIG. 5, a pair of right and left Y-axis tables 42a and 42b are disposed on the top portion of a main body frame 41, with an X-axis table 43 being moveable in the Y-direction thereon. Furthermore, a Z-axis table 44 is disposed movably in the X-direction along the X-axis table 43, with an engagement head (not shown, see FIG. 4) having the suction nozzle 1 built-in in the Z-axis table 44 for its free movement in the Z-direction. Also, a carrier positioning means 45 of a circuit basic plate B for engaging the electronic parts p is disposed in the front portion of the top face of the main body frame 41 and a parts feed portion 46 is disposed in the rear portion thereof, so that the suction nozzle 1 is adapted to move between the suction position of the parts feed portion 46 and an optional position whereat the electronic parts p should be engaged with the circuit basic plate B.

Figure 6:
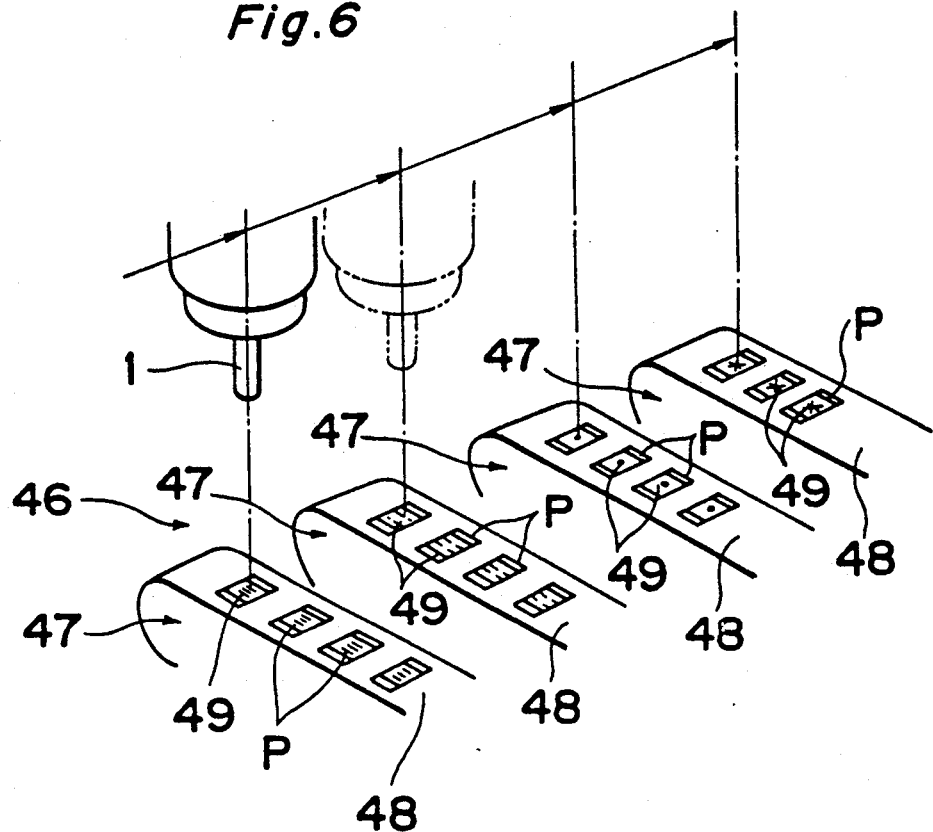
FIG. 6 is a perspective view illustrating an operation during a parts data inputting operation.

As shown in FIG. 6, electronic parts collections 48, each having a plurality of electronic parts p accommodated in one row in a tape-shaped member, are engaged with the parts feed portion 46. A plurality of parts feed cassettes 47 are disposed in parallel so that the electronic parts collections 48 may be fed toward the suction position one pitch by one pitch. Also, the electronic parts p accommodated in the respective electronic parts collections 48 are of the same type, with the respective electronic parts p having marks 49 thereon to show the types.

Figure 7A:
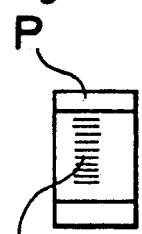
FIGS. 7 (a), 7 (b), 7 (c) and 7 (d) are plan views showing examples of marks given to parts.
Figure 7B:
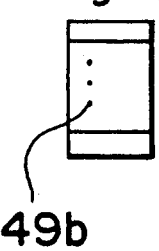
Figures 7C, 7D:
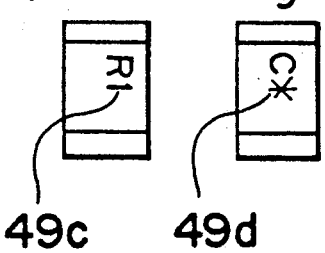

As shown in FIGS. 7 (a), (b), (c) and (d), optional types of marks are adopted as marks 49, for example symbols easy to be binary-coded such as bar codes 49a, dot codes 49b, etc., letters 49c, combinations 49d of letters and symbols and the like.

Figure 8:
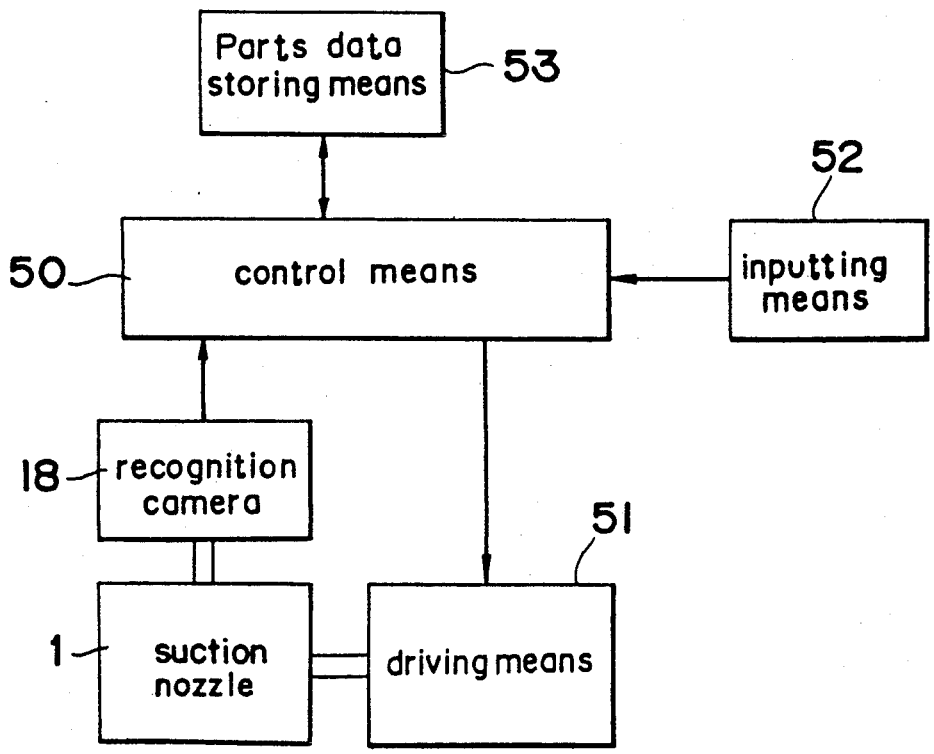
FIG. 8 is a block diagram of the electronic parts engaging apparatus.

As shown in FIG. 8, the suction nozzle 1 is driven by a driving means 51, such as each motor disposed on the Y-axis, X-axis and Z-axis tables 42a, 42b, 43 and 44, to be controlled by a control means 50. The signals are inputted from an input means 52 and a recognition means 128 into the control means 50. A parts data storing means 53 for storing the arrangement condition of the electronic parts in the parts feed portion 46 is connected with the control means 50.

Figure 9:
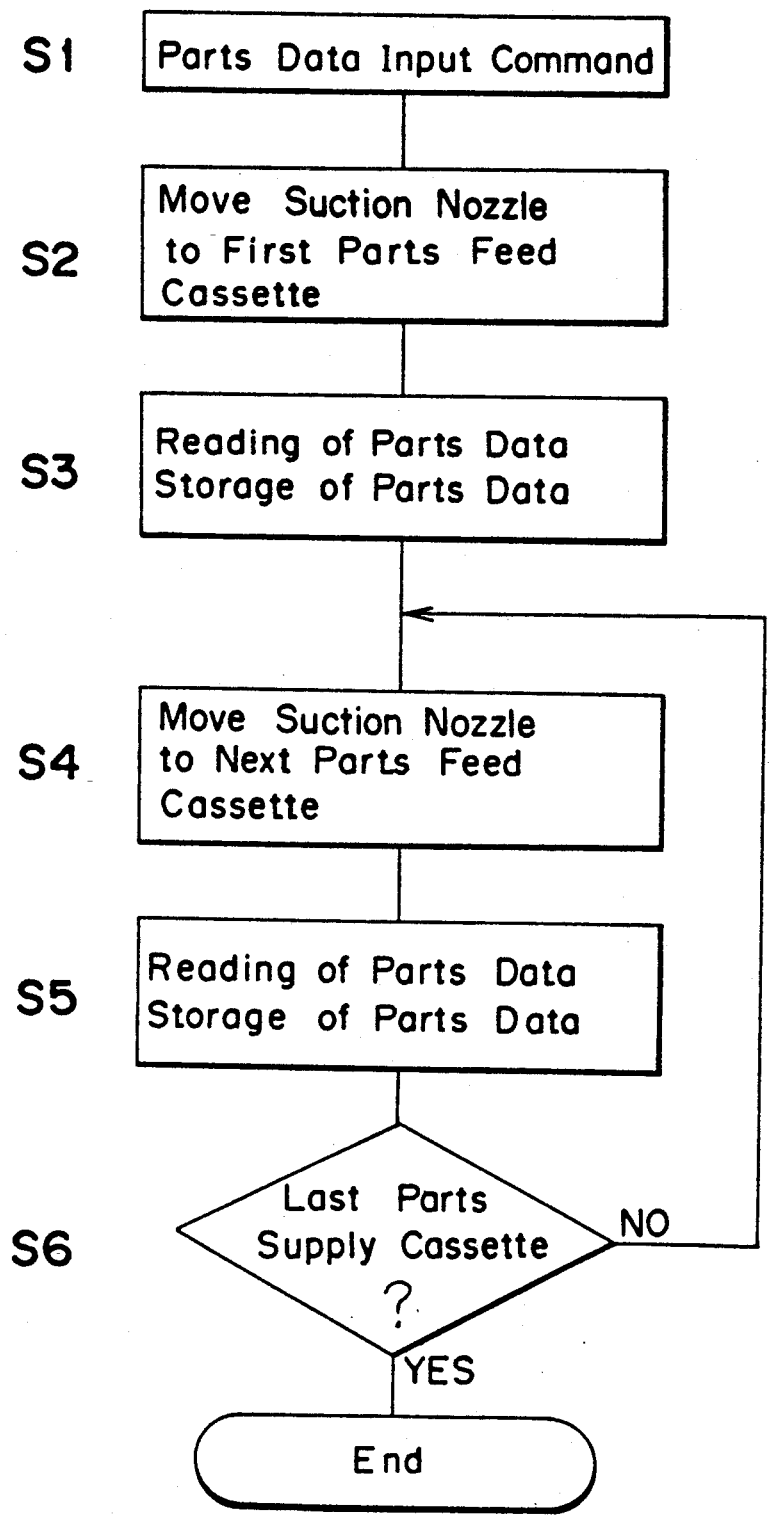
FIG. 9 is a flow chart of the parts data inputting operation.

The operation will be described hereinafter. Prior to the engagement of the electronic parts p, the data on the arrangement condition of the parts in the parts feed portion 46 are inputted with respect to the parts data storing means 53. As shown in FIG. 9, when a parts data input instruction is issued to the control means 50 from the inputting means 52 (S1), the suction nozzle 1 is moved into the parts suction position of a first parts feed cassette 47 (S2) to read the mark 49 of the electronic parts p with the recognition camera 18 for discriminating between the types of the electronic parts p so as to store them on the parts data storing means 53 (S3). As shown in an imaginary line in FIG. 6, the suction nozzle 1 moves into the parts suction position of the next parts feed cassette 47 (S4) so as to read the marks 49 of the electronic parts p as described hereinabove for discrimination between the types of the electronic parts p to store them in the parts data storing means 53 (S5). Then, a judgement is made as to whether or not the cassette is the last parts feed cassette 47 (S6). When the cassette is not the last parts feed cassette 47, the step returns to the step S4 to repeat the above-described operations as far as the last parts feed cassette 47 so as to store the types of the electronic parts p from all the parts feed cassettes 47.

The engagement operation of the electronic parts p will be described hereinafter. The arrangement position of the parts feed cassette 47, wherein the electronic parts p are accommodated, are read from the parts data storing means 53 by the control means 50 so as to position the nozzle oppositely above the suction position of the parts feed cassette 47, wherein the suction nozzle 1 is specified by the driving means 51 for recognition of the mark 49 and the shape of the electronic parts p in the suction position through the suction nozzle 1 and the light transmitting plate 5, each being made of a light transmitting material, and with the recognition camera 18. When the electronic part p is improper in type and shape, the operation does not go into the suction operation, and the next electronic part p is fed as it is into the suction position for recognition of the type and shape thereof by the recognition camera 18. When the type and shape of the electronic part p is proper, the moving table 23 is lowered to suction the electronic part p with the suction nozzle 1. After it has been raised again, the X-axis table 43 and the Y-axis tables 42a and 42b are operated to position the moving table 23 above a given engagement position on the circuit basic plate B.

At this time, the position of the suctioned electronic part p is recognized by the recognition camera 18 to detect the eccentric amount in the X-direction and the Y-direction, and the inclination angle θ with respect to the engagement posture of the electronic part p and the correction thereof is effected by the correction of the movement amount of the X-axis table 43, the Y-axis tables 42a and 42b, and the rotation of the pulley 16. Thereafter, the electronic part p is correctly engaged with the given position of the circuit basic plate B through the lowering of the moving table 23.

By the repetition of the above-described operation, proper electronic parts p are efficiently engaged sequentially at the electronic parts engagement positions on the circuit basic plate B.

Figure 10:
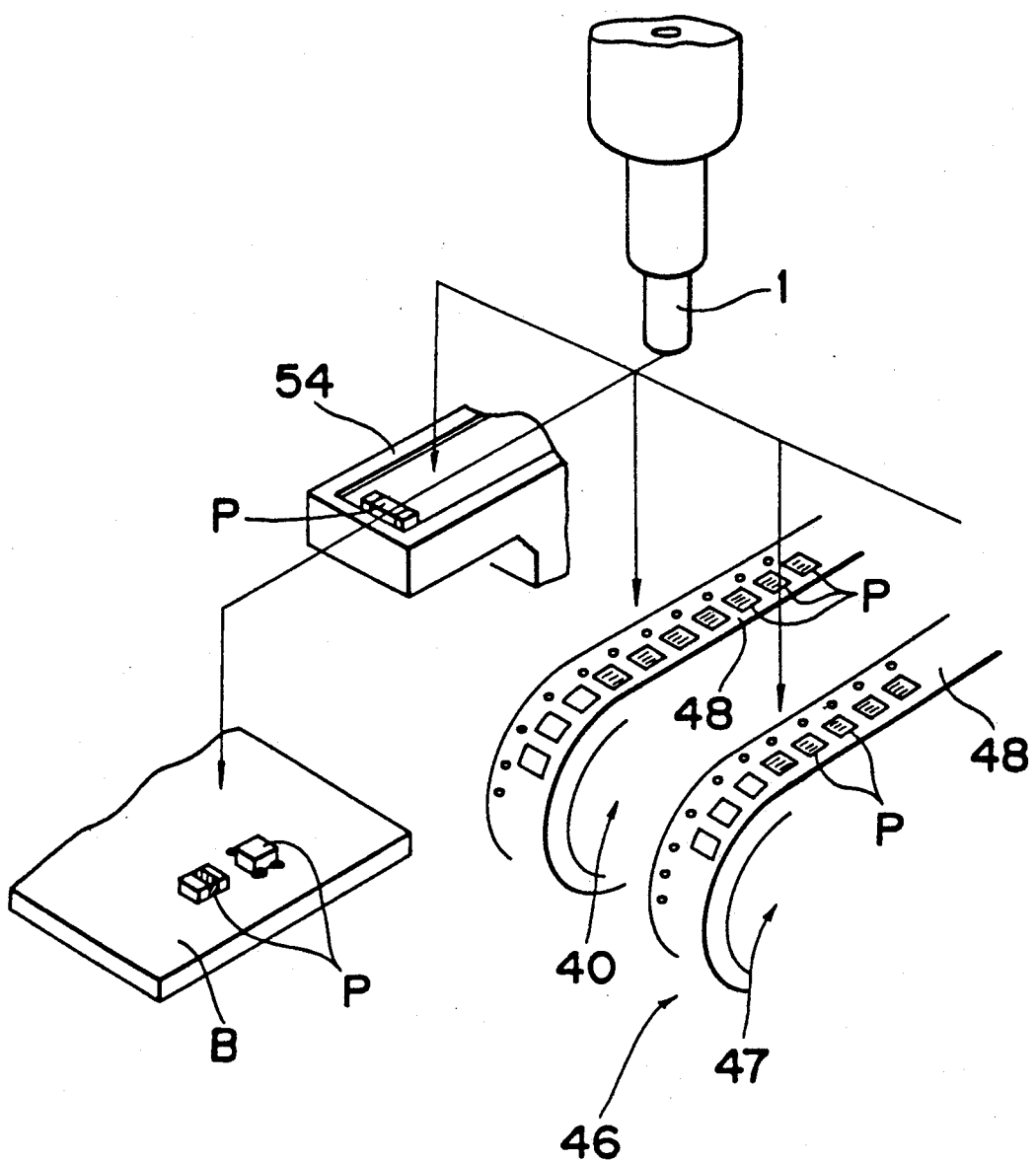
FIG. 10 is a perspective view of essential portions of a parts feed portion according to a fourth embodiment.

A fourth embodiment of the present invention will be described hereinafter with reference to FIG. 10 and FIG. 11. As the construction of the embodiment is basically the same as that of the above-described embodiment, the detailed description thereof will be omitted. In this embodiment, a temporary reservation portion 54 for temporarily reserving the electronic parts is disposed on one side of the arrangement of the parts feed cassette 47 of the parts feed portion 46. Also, when the type of the electronic parts p recognized in the parts feed portion 46 is not a specified type, the control means 50 does not feed the next electronic part p as shown in the third embodiment, and does not disuse the electronic part p fed by errors. The parts are suctioned, carried into the temporary reservation portion 54 so that the parts are adapted to be taken out with priority from the temporary reservation portion 54 and engaged when an electronic part p of this type is engaged.

Figure 11:
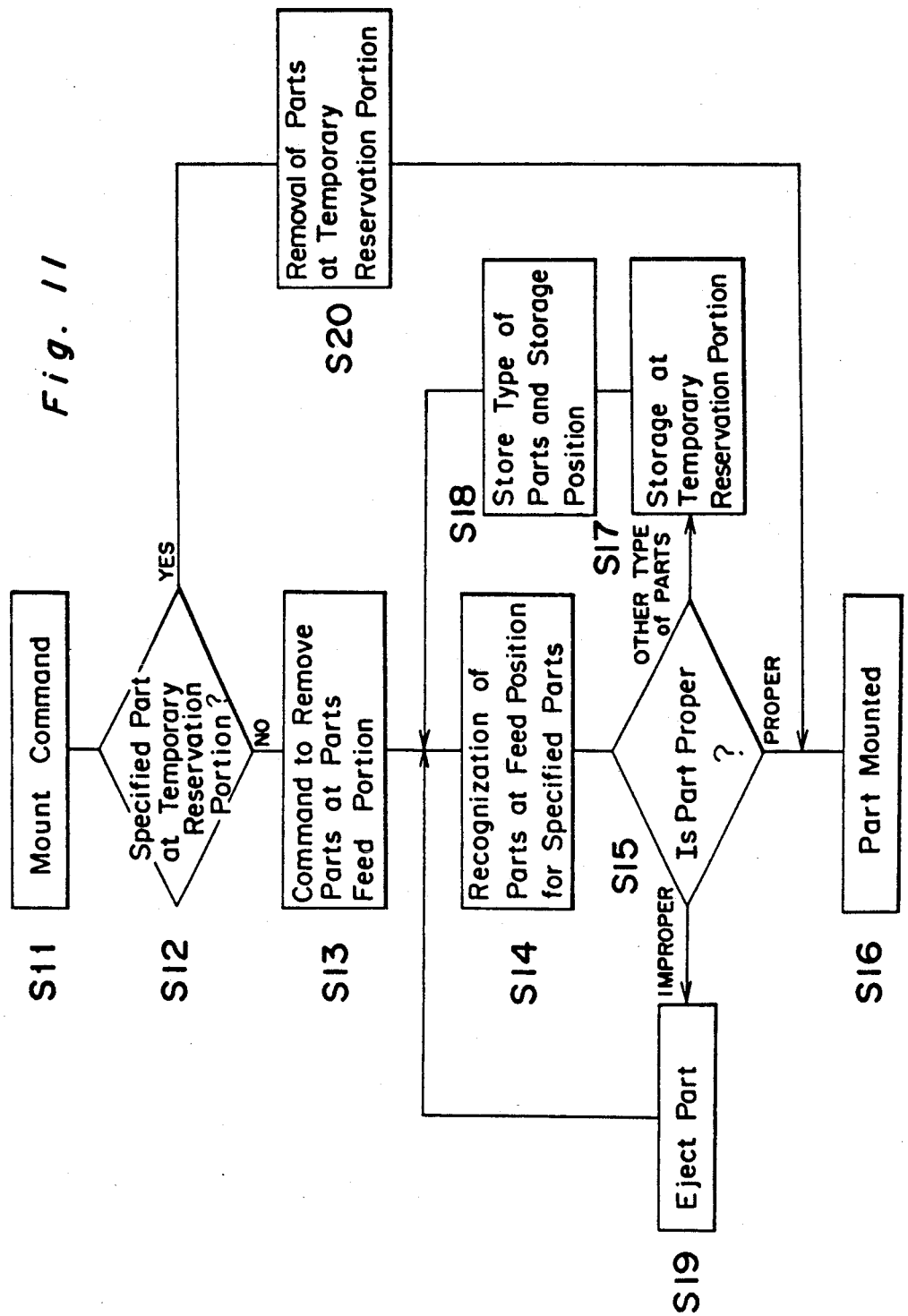
FIG. 11 is a flow chart of a parts engaging operation.

The details of the engagement operation are shown in FIG. 11. Referring now to FIG. 11, the steps S11 through S16 show the operation in a case where the specified electronic parts p do not exist in the temporary reservation portion 54 and the electronic parts p recognized in the parts feed portion 46 are proper. When the type of the electronic part p is different at step 15, the parts are temporarily kept in the temporary reservation portion 54 and the type and the storage position of the electronic part p are stored at the steps S17 and S18. Thereafter the operation returns to the step S14 so as to engage the next electronic part p. When the recognized electronic part p is improper in shape or the like, the electronic part p is disused and the operation returns to the step S14. When the type of the specified electronic part p exists in the temporary reservation portion 54 in the judgement of the step S12, the electronic part p is taken out from the temporary reservation portion 54 (step S20) to effect the parts engagement.

Although the fourth embodiment shows an example in which the electronic parts p are stored in the temporary reservation portion 54 when the type of the electronic parts p is different through the recognition of the electronic parts p in the parts feed portion 46, the operation program of the control means 50 may be constructed so that the recognized electronic parts p are suctioned up and used as they are, with the replacement of the engagement order of the electronic parts p, so as to engage the electronic parts p in the correct position of engagement of that part.

According to the present embodiment, the marks of the respective parts are recognized by the recognition means through the suction nozzle when the arrangement data of the respective parts in the parts feed portion are inputted to the memory means so as to store the types of parts found on the memory means. The inputting operation of the arrangement data of the parts may be effected automatically, so that the bother and time of inputting the data may be saved and the troubles caused by inputting errors may be removed.

When the recognized part is different from the specified part for engagement, the part is suctioned up and carried into the temporary reservation portion so as to effect engagement with priority from the temporary reservation portion or replace the engagement order of the part at the time for the engagement of the part in the correct position. Therefore parts fed by mistake are not wasted through the disuse thereof, with large effects in the case of parts of higher functions.

A fifth embodiment of the present invention will be described hereinafter.

The present embodiment is characterized in that dirt in the suction nozzle 1 and the light transmitting plate 5, each being made of a light transmitting material, is removed to prevent recognition errors.

Figure 12:
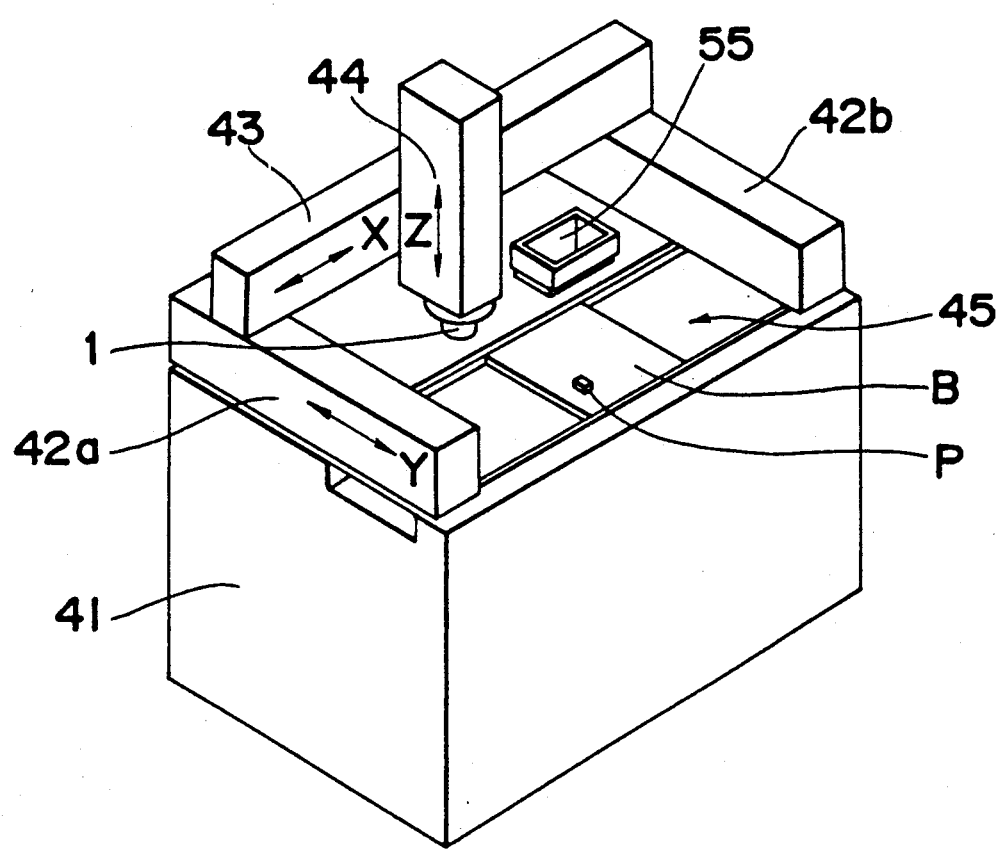
FIG. 12 is a perspective view according to a fifth embodiment of the present invention.

The difference between FIG. 12 and FIG. 5 is that an ultrasonic wave washing cell 55 is disposed in FIG. 12.

Figure 13:
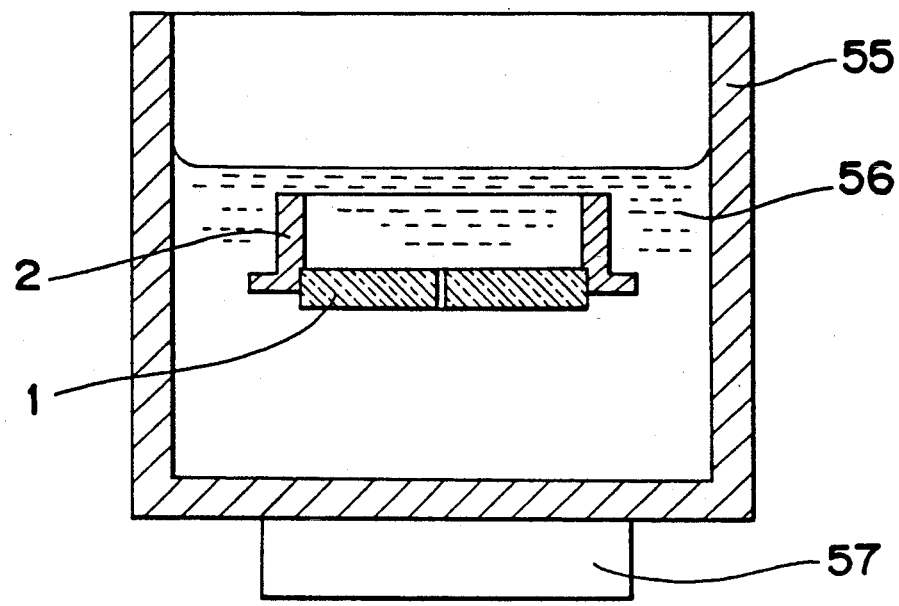
FIG. 13 is a construction view of an ultrasonic wave washing cell.

As shown in FIG. 13, the ultrasonic wave washing cell 55 has a washing liquid 56 inside and an ultrasonic wave generator 57 mounted on its bottom face. The suction nozzle 1 together with the nozzle holder 2, or the light transmitting plate 5 together with the suction drum 3, is simply dipped in the washing liquid, thus making it possible to wash the suction nozzle 1 and the light transmitting plate 5.

Figure 14:
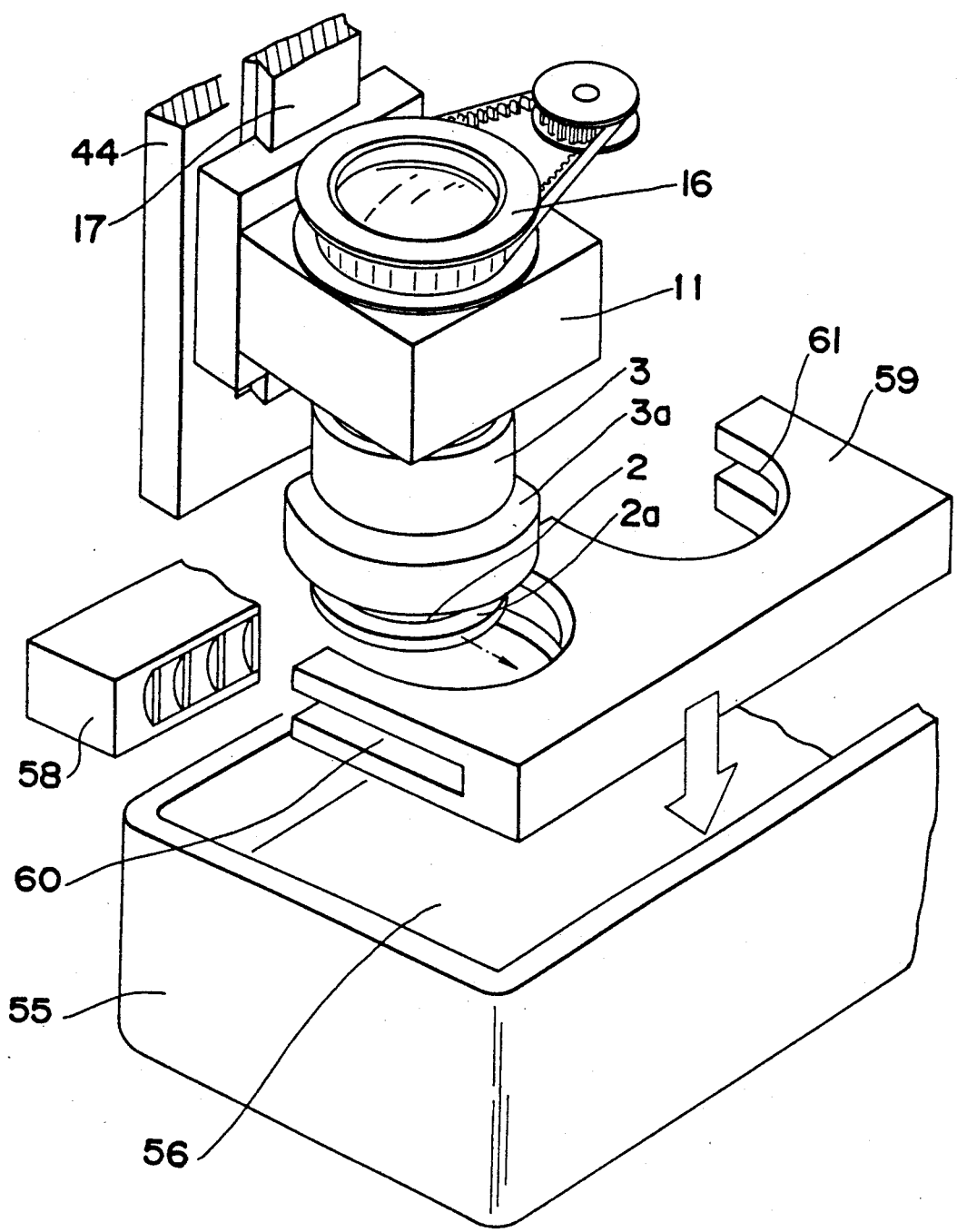
FIG. 14 is a perspective view showing a washing operation.

Also, a drying means 58 for blowing a hot blast upon the nozzle holder 2 and the suction drum 3, picked up from within the washing cell 55 so as to dry them, is disposed within the ultrasonic wave washing cell 55, as shown in FIG. 14. Furthermore, there is additionally provided an operating means 59 for automatically washing the suction nozzle 1 and the light transmitting plate 5. The operating means 59 may rise and lower by a driving means (not shown) between a position where they are dipped into the washing liquid 56 within the washing cell 55 and a position where they are raised. An engagement supporting rim 2a projectingly formed on an engagement supporting rim 3a projectingly formed on the outer periphery of the nozzle holder 2 and the outer periphery of the suction drum 3 may be inserted from the horizontal direction. Upon insertion, engagement portions 50 and 51 retain the rims through engagement in the vertical direction. The nozzle holder and the suction drum 3 may be engaged with or disengaged from the operating means by the raising and lowering of the moving table 23, with the engagement supporting rim 2a of the nozzle holder 2 or the engagement supporting rim 3a of the suction drum 3 being engaged with the engagement portion 60 or 61.

Figure 15A:
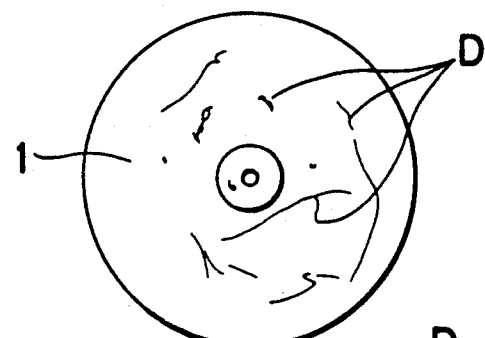
FIG. 15 (a) is a plan view showing a fouled condition of a suction nozzle.
Figure 15B:
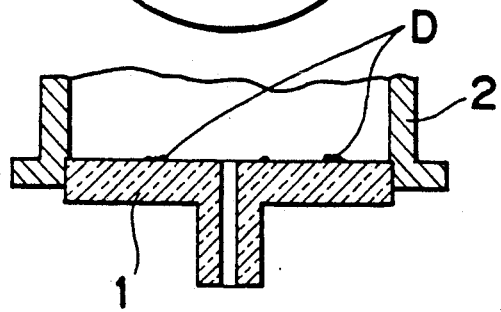

During the suction of the electronic parts p, dust or the like, together with the suction air-current, is admitted into the suction chamber. When the dust D collects on the suction nozzle 1, or similarly, the dust D has collected on the light transmitting plate 5 as shown in FIG. 15 (a), (b), it is detected by the recognition camera 18. Therefore, an operation program is made so that the dust of the suction nozzle 1 and the light transmitting plate 5 may be detected by the recognition camera 18 for each engagement operation or for each proper number of engagements. As a dirt detecting system, there is a step of, for example, positioning the suction nozzle 1 on an illumination member or a white pattern recognized by the recognition camera 18 to detect the dirt with a number of picture elements, when a picture level becomes black because of the dust, being more than a constant number.

If the dirt of the suction nozzle 1 or the light transmitting plate 5 is detected, a washing operation instruction is transmitted so as to move the engagement head towards the ultrasonic wave washing cell 55. After the engagement supporting rim 2a of the nozzle holder 2 has been inserted into the engagement portion 60 of the operating means 59 from the horizontal direction, the moving table 23 is raised to cause the nozzle holder 2 to engage with the operating means 59. Similarly, the engagement supporting rim 3a of the suction drum 3 is retained through engagement with the engagement portion 61 of the operating means 59. Thereafter, an alternate suction drum 3 and nozzle holder 2 are mounted on the engagement head so as to be restored into the engagement operation.

The nozzle holder 2 and the suction drum 3 retained through the engagement with the operating means 59 are dipped into the washing liquid 56 of the washing cell 55 by the lowering of the operating means 59, and the suction nozzle 1 and the light transmitting plate 5 are washed with ultrasonic waves. After the washing operation of a certain time period, the operating means 59 is raised to pick them up from the washing cell 55, so that they are dried with the hot blast from the drying means 58. After the completion of the washing and drying operations, they are kept waiting as they are. The absorption drum 3 and the nozzle holder 2 are mounted on the engagement head through an action opposite to the above-described action at a proper time, as so to be restored into the engagement operation of the parts.

In addition to the washing operation through the detection of dirt as described hereinabove, the washing operation may be effected periodically at such a time period as dirt normally may not collect.

In the above-described embodiment, the ultrasonic wave washing cell is used as the washing means, but another washing means may be used. In the above-described embodiment, in the engagement head provided with the suction nozzle and the light transmitting plate, an example is shown wherein both the nozzle and the plate are simultaneously washed. When only either one of them is dirty, only the one may be washed. Also, in the case of the engagement head being provided with the suction nozzle only, it is better to naturally wash the suction nozzle only.

As is clear from the foregoing description, according to the arrangement of the present invention, when the suction nozzle and the light plate become dirty, the dirt may be detected, or they may be washed periodically before they become dirty, by the additionally held washing means such as an ultrasonic wave washing cell or the like. The recognition error caused by the recognition means may thus be prevented from being given.

Also, when an ultrasonic wave washing cell is used as a washing means, a higher degree of washing may be easily attained.

Also, by the provision of a drying means, the suction nozzle and the light transmitting plate may be put into a condition of use in a short time after the washing operation.

Furthermore, the washing means is disposed within a movable range of the suction nozzle and the operating means, which raises and lowers between the upper position of the washing cell and the washing cell interior, with the suction nozzle and the light transmitting plate engaged, is provided to make it possible to effect the automatic washing operation.

Also, a recognition means for recognizing the suction parts is used to detect the dirt, and to effect the washing operation. A wasteful washing operation is eliminated, thus retaining a higher rate of operation.

Also, the periodical washing operation has an effect that the control operation is simplified.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. An electronic parts engaging apparatus, comprising:
   a suction nozzle made of a light transmitting material;
   a recognition means for recognizing, through said suction nozzle, the shape of the electronic parts suctioned by said suction nozzle; and
   a light ray applying means for applying light rays through said suction nozzle;
   wherein said suction nozzle has an axial center and said recognition means and said light ray applying means are selectively positioned on said axial center of said suction nozzle.

2. The electronic parts engaging apparatus as set forth in claim 1, wherein said light-ray applying means is an ultra-violet ray source.

3. The electronic parts engaging apparatus as set forth in claim 1, wherein said light-ray applying means is a laser light.

4. The electronic parts engaging apparatus, as set forth in claim 1, wherein:
   said suction nozzle is held by an nozzle holder, and said nozzle holder is engaged with a suction drum.

5. The electronic parts engaging apparatus as set forth in claim 4, wherein said suction drum comprises an open end communicating with said suction nozzle, a closed end closed by a light transmitting plate, and a suction opening on the periphery thereof.

6. The electronic parts engaging apparatus as set forth in claim 4, wherein said suction drum is connected to a rotary drum for rotation therewith, and said rotary drum has a pulley at an end thereof opposite said suction drum for rotation of said rotary drum, said suction drum and said suction nozzle, whereby an electronic part can be properly angularly positioned.

7. The electronic parts engaging apparatus as set forth in claim 6, wherein:
   said rotary drum is mounted on rotary bearings, which are in turn mounted to an elevating member;
   said suction drum has an outer drum mounted thereon, rotatable on said suction drum, and connected to said elevating member; and
   said elevating member is vertically displaceably connected to a moving table for vertical movement therewith.

8. The electronic parts engaging apparatus as set forth in claim 1, wherein said light transmitting material of said suction nozzle has a central nozzle opening for applying suction to the electronic parts.

* * * * *